United States Patent
Coolen et al.

(10) Patent No.: US 7,931,750 B2
(45) Date of Patent: Apr. 26, 2011

(54) SEALING LOCK FOR A DEPOSITION LINE IN VACUUM ON A FLAT PRODUCT

(75) Inventors: Stéphane Coolen, Nandrin (BE); Eric Silberberg, Gesves (BE); Didier Marneffe, Engis (BE); Bernard D'Hondt, Brussels (BE); Claudio De Felice, Juprelle (BE)

(73) Assignee: Arcelor France, Saint Denis (FR)

( * ) Notice: Subject to any disclaimer, the term of this patent is extended or adjusted under 35 U.S.C. 154(b) by 0 days.

(21) Appl. No.: 10/557,214

(22) PCT Filed: Apr. 19, 2004

(86) PCT No.: PCT/BE2004/000055
§ 371 (c)(1),
(2), (4) Date: Nov. 17, 2005

(87) PCT Pub. No.: WO2004/104264
PCT Pub. Date: Dec. 2, 2004

(65) Prior Publication Data
US 2006/0236942 A1 Oct. 26, 2006

(30) Foreign Application Priority Data
May 23, 2003 (EP) .................................... 03447123

(51) Int. Cl.
*C23C 16/06* (2006.01)
*H01L 21/306* (2006.01)
(52) U.S. Cl. ...... 118/718; 118/715; 118/733; 156/345.2
(58) Field of Classification Search .................. 118/718, 118/715, 733; 156/345.2
See application file for complete search history.

(56) References Cited

U.S. PATENT DOCUMENTS

| 2,963,001 | A | * | 12/1960 | Alexander | .................... | 118/718 |
| 3,158,507 | A | | 11/1964 | Alexander | | |
| 3,367,667 | A | | 2/1968 | Allen | | |
| 3,467,399 | A | | 9/1969 | Kelly et al. | | |
| 3,868,106 | A | | 2/1975 | Donckel et al. | | |
| 4,501,428 | A | * | 2/1985 | Ueno et al. | ..................... | 277/345 |
| 5,000,114 | A | * | 3/1991 | Yanagi et al. | ................. | 118/733 |
| 5,842,855 | A | * | 12/1998 | Nakamura | ..................... | 432/242 |
| 5,865,932 | A | | 2/1999 | Funabashi et al. | | |
| 6,050,446 | A | * | 4/2000 | Lei et al. | ........................ | 220/819 |
| 6,159,300 | A | * | 12/2000 | Hori et al. | ...................... | 118/718 |

FOREIGN PATENT DOCUMENTS
EP 0 535 568 A1 4/1993
JP 01042578 * 2/1989
JP 01042578 A * 2/1989

* cited by examiner

*Primary Examiner* — Ram N Kackar
*Assistant Examiner* — Satish Chandra
(74) *Attorney, Agent, or Firm* — Merchant & Gould P.C.

(57) ABSTRACT

The invention relates to a sealing lock, for an in vacuo chamber for deposition on a, preferably metallic, endless strip, characterized in that: the metal rollers are mounted on brackets, fixed to the covers and are immovable like the latter, the rollers of the same pair have the axes thereof arranged in the same vertical plane and are of different diameter, the position of the roller with the smaller diameter being alternated up and down on passing from a given pair to the next pair, the support cradles for the two rollers of the same pair have a lateral projection towards the center, the spacing of which with regard to the base for said rollers defines a second gap.

10 Claims, 2 Drawing Sheets

SEALING LOCK FOR A DEPOSITION LINE IN VACUUM ON A FLAT PRODUCT

FIELD OF THE INVENTION

The present invention relates to an improved sealing lock at the inlet and/or outlet of a deposition line for a thin layer under vacuum on a flat product in motion, preferably a metal strip (carbon steel, stainless steel, etc.)

STATE OF THE ART

Inside a deposition chamber under vacuum (pressure of the order of $10^{-5}$ mbar), numerous processes can be implemented: cleaning, deposition, etc.

In siderurgy and metallurgy, lines for the continuous deposition of metal (pure metals, alloys, oxides) or organic depositions under vacuum are increasingly attractive for several reasons.

Firstly, they offer very easy development of new products. Up to day, the coating of steel strips is industrially limited to the processes of dip coating or electrolysis, which are traditional processes. The number of products thus obtained is very limited. The industrial use of deposition lines in vacuum, the principle of which is currently finalised on pilot lines, would allow to achieve dozens of new products.

Then, from the environmental point of view, if the process of dip coating is relatively clean, apart from the production of mats, the electrolysis process requires associated chemical treatments such as filtering, regeneration, the treatment of sediments, etc. In all cases, the surface preparation produces effluents to be treated in the form of baths and sediments. In contrast, vacuum deposition, whether implementing a plasma or not, is a dry process. Only the dry waste from the surface cleaning and the deposition losses have to be recovered.

Sealing locks are known that are intended to isolate the deposition chamber in vacuum from the other elements of the line such as unwinders, winders, etc. The lock is an element whose control is very important for the stage of industrial implementation. The state of the art describes embodiments of locks (U.S. Pat. Nos. 3,158,507, 3,367,667, 3,467,399, 3,868,106, 4,501,428, 5,000,114, EP-A-0 535 568, U.S. Pat. Nos. 5,842,855, 5,865,932). Most of these embodiments have not resulted in effective industrial implementation.

Most of the time, in order to prevent against leaks occurring at the inlet or outlet locks, which are the weak points, the use of locks is avoided. With glass, batch deposition is achieved on plates with standard dimensions. With plastics, the winding solution in the vacuum chamber itself is adopted.

An example of an inlet/outlet lock 5 for a deposition chamber in vacuum is shown in FIG. 1. In this lock, nine rollers 10, 11, 12, . . . are arranged in staggered rows and define seven sub-chambers 20, 21, 22, . . . . Each of the sub-chambers is connected to a pumping system 3. The pumping systems 3 taken together allow to obtain a progressive vacuum from chamber to chamber 20, 21, 22, . . . , the value of which in the last sub-chamber can reach $10^{-5}$ mbar. The staggered arrangement helps to reduce the number of rollers and the compactness of the lock. Moreover, the strip forms an arched shape when passing through the rollers, which in fact ensures a good seal along the width of the strip, which is significantly improved relative to a simple gap of the rollers. In this way, greater spacing between two rollers becomes acceptable.

Depending on the case, each roller is moreover located in a cradle fastened to the lower or upper horizontal wall of the chamber facing the roller. There, the leak is reduced to the spacing or gap between the roller and the cradle. There also remain leaks between the sides of the cylindrical rollers and the lateral walls of the chamber.

Lastly, in order to maintain the seal in each sub-chamber, it is necessary for the contact pressure between the strip and the rollers serving the seal of a sub-chamber to be at least equal to the difference in the pressures between said sub-chamber and its environment. Otherwise, there is a risk of the strip lifting off from the roller. To avoid this problem, sufficient traction should be applied to the strip to make up for the difference in pressure existing between two successive sub-chambers.

For industrial application in the case of continuous motion, many problems of the state of the art need to be resolved. First of all, there is the problem of the ability to maintain the equipment. Inserting the strip into the lock must be easy. Moreover, the housing forming the vacuum chamber is limited in height and access is thus difficult. For example, it is necessary, according to the current state of the art, to completely dismantle the chamber in order to check the state of the surfaces of the rollers. Another existing problem is linked to the vacuum losses associated with leaks occurring in the lock, which affects the pumping performance. This leads to high consumption of electricity and heavy investment in pumping equipment.

By definition, the low level or lack of thermal exchanges in the part of the housing under vacuum does not imply any expansion of the rollers on the vacuum side. In fact, the only rough contact is insufficient to ensure thermal conduction between the hot strip and the rollers located on the vacuum side. On the other hand, expansion of the rollers occurs on the air side by thermal exchange, which possibly spreads to the outer cover of the housing. This expansion in length of the rollers increases the risk of seizing as a result of their contact with the lateral walls of the chamber. The deformation is indeed not matched by the outer part of the housing located on the air side, to the extent that the latter is securely fastened to the part located on the vacuum side that does not expand.

AIMS OF THE INVENTION

The present invention aims to provide an inlet/outlet sealing lock for a deposition line in vacuum on a flat product that allows to overcome the drawbacks of the state of the art.

The invention aims in particular to provide a sealing lock that may be used on a continuous deposition line in vacuum on a flat metal product such as a carbon steel or stainless steel strip.

The invention additionally aims to provide a low-maintenance lock (insertion of the strip, access to the rollers, etc.).

The invention also aims to provide a lock that allows better pumping performance while at the same time reducing the associated electrical consumption and minimising the necessary equipment.

The invention also aims to eliminate the risk of the rollers seizing up associated with the expansion of the metal parts partially under vacuum.

Lastly, the invention aims to prevent the preferential wear of the rollers provided with an additional rubber coating.

MAIN CHARACTERISTIC ELEMENTS OF THE INVENTION

A first object of the present invention relates to a sealing lock for a deposition chamber in vacuum on a strip, preferably of metal and in continuous motion, having detachable lower and upper covers comprising several pairs of metal rollers between which the strip passes and that are held in a cradle fastened to the facing cover with a gap defining a first leak, two successive pairs of rollers defining a sub-chamber maintained at a set pressure, lower than atmospheric pressure, by a pumping unit connected to said chamber, characterised in that:

the rollers are mounted on bearings fastened to said covers and are also detachable;

the rollers of a same pair have their axes arranged in a same vertical plane and have different diameters, the position of the roller with the smaller diameter being alternately low/high, when one goes from one given pair of rollers to the adjacent pair;

the cradles supporting the two rollers of a same pair have a lateral protrusion towards the centre, the gap of which relative to the lateral surface of said rollers defines a second leak.

According to a preferred embodiment of the invention, the rollers with the smaller diameter are coated with a certain thickness of rubber or elastomer.

Advantageously, the rollers with the larger diameter are rollers with surfaces in contact with the strip that are metal and define the passage line of the strip.

According to an even more preferred embodiment, two rollers of a same pair are out of line in the transverse direction relative to the motion of the strip in such a way that, on each lateral side of the lock, one of the rollers is protruding relative to the other roller.

In a particularly advantageous way, the seal of each sub-chamber of the lock is ensured between the strip and the body of the two rollers by prestressing the rubber-coated roller against the roller with the metal surface, which at the same time allows the passage of the strip and the squeezing of the rubber or elastomer around the strip.

Still advantageously, the angle of the direction change of the strip is determined by the ratio of the diameters of the rollers of a same pair and is less than 10°.

One essential advantage of the invention is that it allows the lowest pressure reigning in a sub-chamber to be lower than $10^{-4}$ mbar, preferably $10^{-5}$ mbar.

The gap or space that characterises the first leak is preferably a function of the maximum width of the strip whereas that characterising the second leak is essentially constant and lower than 0.3 mm, preferably 0.2 mm.

A second object of the present invention relates to an installation of the type deposition line under vacuum for a thin metal or organic layer on a flat iron and steel or metal product in motion at a speed of at least 10 m/min, preferably a strip of carbon steel or stainless steel, comprising an inlet and/or outlet sealing lock as described above.

BRIEF DESCRIPTION OF THE DRAWINGS

FIG. 2 also shows the two detachable covers.

DESCRIPTION OF A PREFERRED
EMBODIMENT OF THE INVENTION

Figure 2:
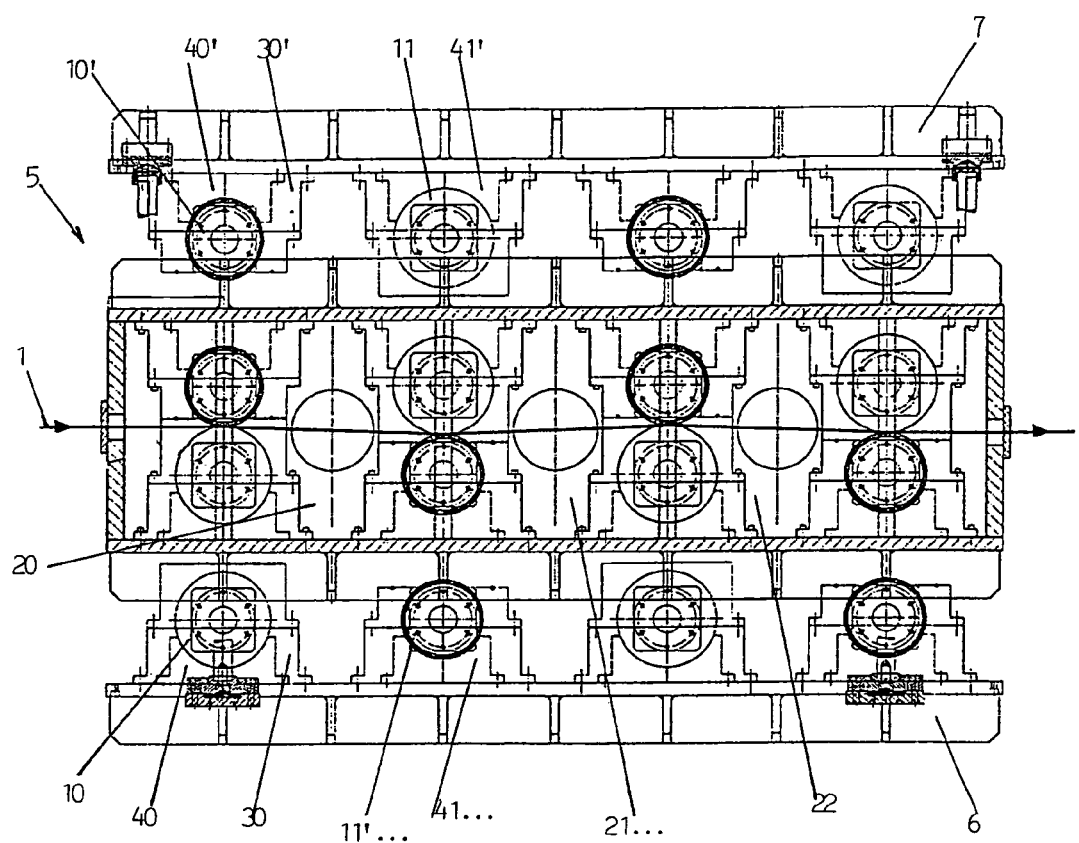
FIG. 2 shows vertical and longitudinal cross-section views of a sealing lock for a vacuum deposition chamber according to a preferred embodiment of the invention.
Figure 3:
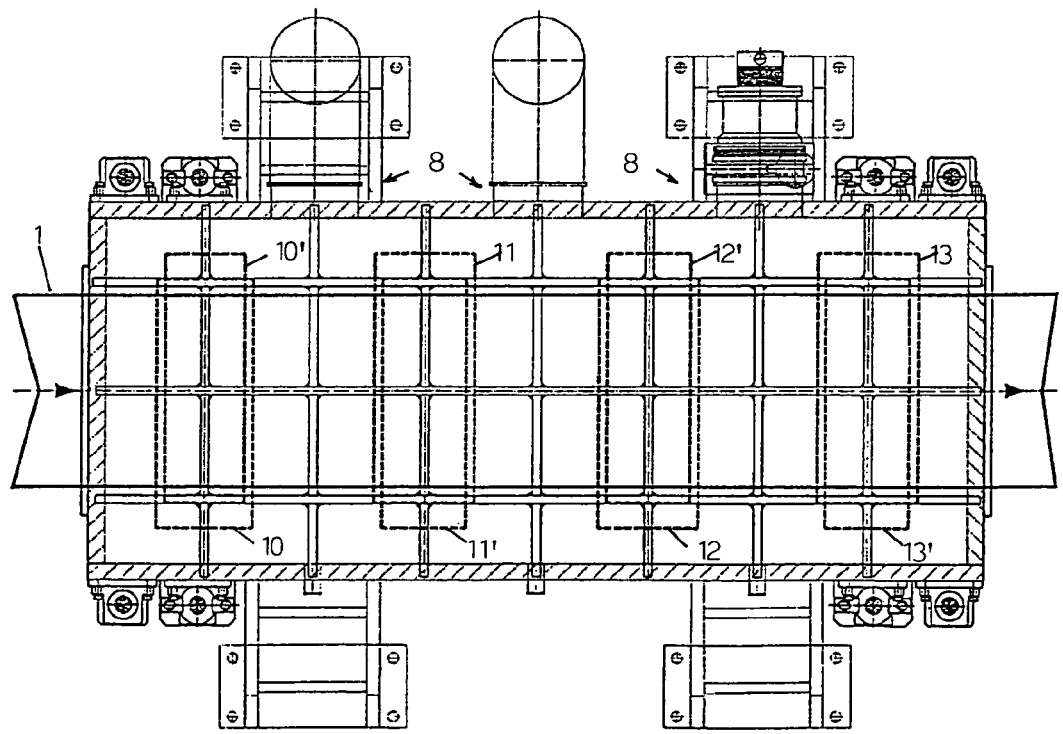
FIG. 3 shows a top view of the sealing lock for the vacuum deposition chamber of FIG. 2.

FIGS. 2 and 3 show an example of the inlet/outlet lock for a deposition chamber in vacuum according to the present invention. The metal strip 1 enters the lock from the left and comes out of it on the right. In the present case, the chamber 5 comprises four pairs of rollers facing each other 10, 10', 11, 11', . . . between which the strip is inserted. Said pairs of rollers define sub-chambers 20, 21, 22, . . . in each of which there is a different pressure, successively decreasing for an inlet lock, for example. In the case of an outlet lock, the reverse situation occurs.

According to the invention, in order to ensure the maintenance of the chamber and the access to the rollers, the roller bearings 30, 30', . . . can be detached and are fastened to the lower 6 or upper 7 cover of the chamber, depending on the position, low or high respectively, of the roller considered. It is also provided that the two covers 6 and 7 can be sufficiently spread apart in a vertical plane by means of jacks 4 shown in FIG. 4. Thus, during a maintenance operation, the rollers or the bearings can be easily accessed. Another advantage lies in the ease of insertion of the strip.

Many elements were designed to improve the seal of the chamber at the level of each pair of rollers.

Firstly, the roller with the smaller diameter 10', 11', 12', . . . is provided, at least over its whole contact surface, with a rubber or elastomer coating. Thus, for each pair of rollers, the metal roller determines the passage line of the strip whereas the position of the rubber-coated roller is initially adjusted so that the latter sufficiently presses against the corresponding metal roller, deforming the rubber so as to fit the profile of the strip (see FIG. 4). Thus, thanks to the squeezing of the strip between the rubber and the bare metal roller, the seal is ensured on the surface of the strip, along its whole length, and on the lateral sides of the strip.

Advantageously, one may ensure that the rollers 10, 10', . . . have different diameters alternately on either side of the strip 1 (for example 300 and 250 mm, respectively). Thus, the strip adopts a path that is not rectilinear (breaking the passage line). With wear concentrating on the greatest contact angle, the wear of the rubber-coated roller is minimised. However, given the fact that the rollers are arranged in pairs and that the strip is pressed between them, the advantage is that there is no more concern about a constraint of ΔP between the atmosphere and the first vacuum sub-chamber, which allows additional pumping in the latter. Moreover, the traction exerted on the strip is not critical for the maintenance of the seal in the various vacuum sub-chambers along the strip.

Moreover, the rollers are held on the side of the cover 6, 7 that faces them in a cradle 40, 40', 41, 41", . . . . This arrangement allows to minimise leakage, depending among other things on the gap between the cradle and the roller, as will be explained below.

Figure 1:
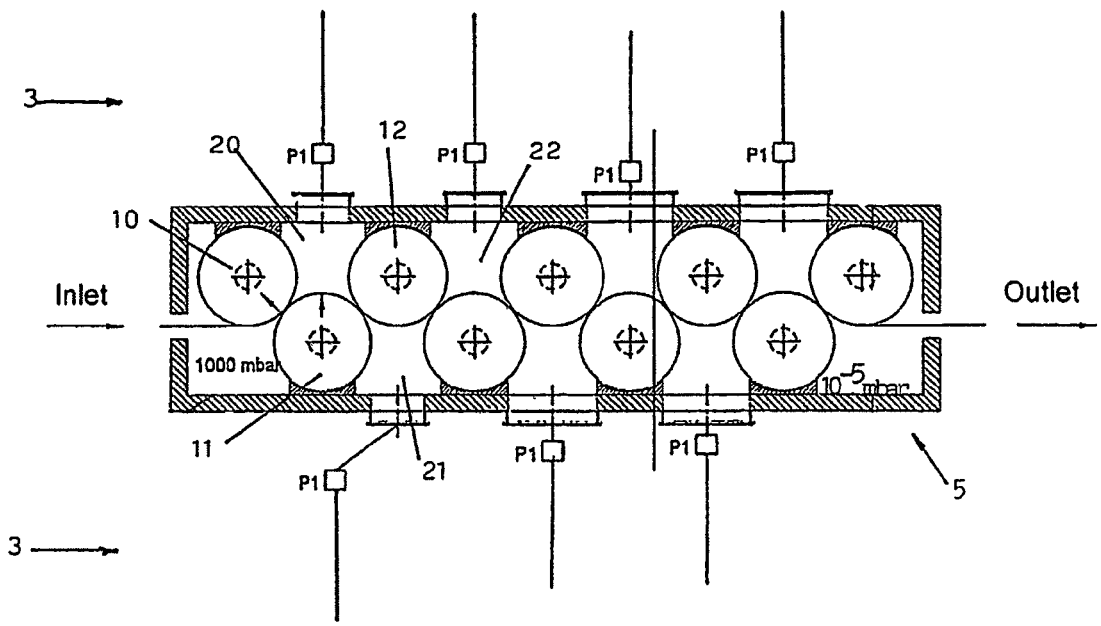
FIG. 1, already mentioned above, shows a cross-section view of a sealing lock for a deposition chamber in vacuum according to the state of the art.
Figure 4:
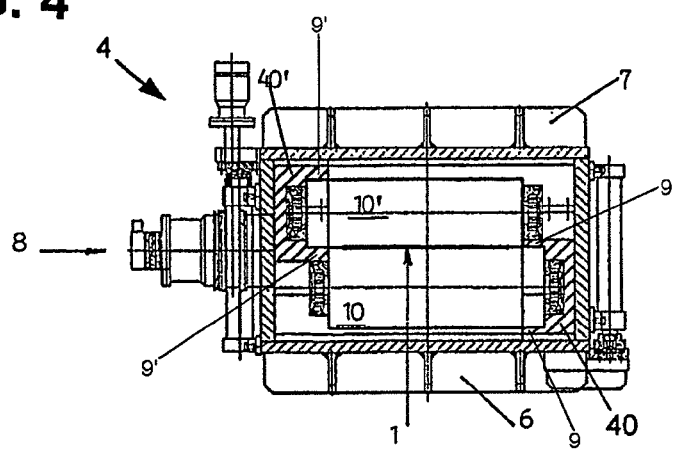
FIG. 4 shows vertical and longitudinal cross-section views of the lock of FIG. 2.

Indeed, according to the invention, the problems of leak and thermal expansion at the level of the lateral walls are solved:

on the one hand by laterally extending the upper (40', . . . ) and lower (40, . . . ) cradles of the rollers by a bend towards the centre (9, 9') as shown in FIG. 4; and on the other hand by offsetting the rollers of each pair (10, 10', . . . ) relative to each other across the width of the chamber.

Thus, from the lateral side, each of the two rollers shows an offset relative to the other roller and vice versa. This arrangement allows the modified cradle (40, 40', . . . ) to be positioned as described above. It should be noted that because of its construction, the modified cradle is not transversally on the same side as the two rollers. On each roller, the bearing corresponding to the modified cradle has a double function:

taking up the thermal expansion of the cylinder considered;

maintaining a constant lateral gap, i.e. independently of said expansion or, equivalently expressed, independently of the actual length of the rollers. The lateral leak, i.e. located along the lateral surface of the roller, is therefore independent of the thermal expansion. The seal is no longer made on the lateral side but on the roller body.

For laminate and molecular flow operations, the passage of the gas through the chamber must be extended as long as possible. In molecular operation, the pumps must be as close as possible to the source and the sections 8 as large as possible (FIGS. 3 and 4).

The improved characteristics of the locks for vacuum deposition chambers according to the invention thus have the following advantages:

- maintenance is made easier and less expensive thanks to the use of detachable sets of rollers;
- pumping efficiency is improved and to the same extent, the consumption of electrical energy and the investment in equipment are reduced as a consequence of the improvement in the seal (offset of the rollers of a same pair, deformation of the rubber-coated rollers);
- the problems of differential expansion of the metal parts as a result of their being subjected to vacuum are solved by adopting modified cradles in the form of bases that fit the bearings and extend in the form of a collar partly covering the body as well as the offset of the rollers;
- the adoption of different diameters for the rollers allows the wear of the metal roller to be enhanced and to minimise that of the polymer.

The invention claimed is:

1. A deposition chamber under vacuum: for deposition of a thin layer on a metal strip in continuous motion having an inlet or outlet sealing lock, comprising:

- detachable upper and lower covers;
- a plurality of pairs of metal rollers between which the metal strip passes and held in cradles fixed to the cover facing the strip with a gap defining a first leak, two successive pairs of rollers delimiting a sub-chamber maintained at a set pressure, lower than atmospheric pressure, by a pumping unit connected to said chamber, wherein:
- the rollers are mounted on bearings fastened to said covers and are configured to be detachable;
- the rollers of a same pair have their axes arranged in the same vertical plane and have different diameters, the position of the roller with the smaller diameter being alternately high and low when one passes from a given pair of rollers to the subsequent pair;
- the rollers with the smaller diameter are coated with a set thickness of rubber or elastomer;
- the rollers with the larger diameter are rollers whose contact surfaces with the metal strip are metal and define the passage line of the metal strip;
- two rollers of a same pair are offset in a transverse direction relative to motion of the metal strip so that on each lateral side of the lock, one of the rollers protrudes relative to the other roller;
- the cradles holding the two rollers of a same pair comprising an upper modified cradle holding the upper roller and a lower modified cradle holding the lower roller, each of said upper and lower modified cradles being configured as a cover of a corresponding roller base and fitting the bearings of the corresponding roller base, said two corresponding bases being opposite on the upper and lower rollers, respectively; each of said modified cradles having a transverse protrusion extending as a collar enclosing a portion of the axial cylindrical surface of the corresponding roller towards a center of the strip, said portion comprising a protruding part of the roller corresponding to an offset between the rollers in the transverse direction, the gap between the transverse protrusion and the axial cylindrical surface of the corresponding roller defining a second leak;
- wherein the transverse protrusions on the cradles extending towards the center of the strip are located on opposite sides of the respective rollers of a same pair.

2. Deposition chamber according to claim 1, wherein the seal of each sub-chamber of the lock is ensured between the metal strip and the axial cylindrical surface of the two rollers by prestressing the rubber-coated roller against the roller with the metal surface, allowing both the passage of the strip and the squeezing of the rubber or elastomer around the strip.

3. Deposition chamber according to claim 1, wherein the angle of direction change of the metal strip is less than 10°.

4. Deposition chamber according to claim 1, wherein the lowest pressure reigning in a sub-chamber is lower than $10^{-4}$ mbar.

5. Deposition chamber according to claim 1, wherein the gap defining the second leak is substantially constant and less than 0.3 mm.

6. Installation of the type deposition line in vacuum for a thin metal or organic layer on a flat iron and steel or other metal product in motion at a speed of at least 10 m/min, comprising a deposition chamber according to claim 1.

7. Deposition chamber according to claim 1, wherein the lowest pressure reigning in a sub-chamber is about $10^{-5}$ mbar.

8. Deposition chamber according to claim 1, wherein the gap defining the second leak is substantially constant and about 0.2 mm.

9. Deposition chamber according to claim 1, wherein the metal strip comprises a strip of carbon steel or stainless steel.

10. Deposition chamber according to claim 1, wherein the upper and lower covers are spreadable apart in a vertical plane by at least one jack.

* * * * *